United States Patent [19]

Petit et al.

[11] Patent Number: 4,521,866
[45] Date of Patent: Jun. 4, 1985

[54] DISTRIBUTED ARITHMETIC OVERSAMPLING RECURSIVE DIGITAL FILTER

[76] Inventors: Jean-Pierre Petit, 16, rue Le Peletier, 22220 Treguier; Xavier Maitre, Route de Pennker, Le Bourg, 22300 Lannion, both of France

[21] Appl. No.: 293,606

[22] Filed: Aug. 17, 1981

[30] Foreign Application Priority Data

Aug. 27, 1980 [FR] France ............................. 80 18579

[51] Int. Cl.³ .......................................... G06F 15/31
[52] U.S. Cl. .................................................. 364/724
[58] Field of Search ............................... 364/724, 723

[56] References Cited

U.S. PATENT DOCUMENTS

| 3,777,130 | 12/1973 | Croisier et al. | 364/724 |
| 3,988,607 | 10/1976 | Eggermont et al. | 364/724 |
| 4,020,332 | 4/1977 | Crochiere et al. | 364/724 |
| 4,146,931 | 3/1979 | DelForge | 634/724 |
| 4,337,518 | 6/1982 | Ohnishi et al. | 364/724 |

OTHER PUBLICATIONS

Goodman et al., "Nine Digital Filters for Decimation and Interpolation," IEEE Trans. on Acoustics, Speech, and Signal Processing, vol. ASSP-25, No. 2, Apr. 1977, pp. 121–126.

Primary Examiner—David H. Malzahn
Attorney, Agent, or Firm—Handal & Morofsky

[57] ABSTRACT

Distributed arithmetic oversampling recursive digital filter comprising a recursive part constituted by q registers of a circulating nature, a non-recursive part of order p constituted by series registers, a memory divided into N memory blocks, a modulo N counter with α outputs, an adder—subtracter connected to the memory, an accumulator register, and a frequency clock $f_s$. The filter is characterized in that the non-recursive part only comprises K series registers, K being an integer defined by the double inequality:

$$(K-1)N + 2^\alpha - N \leq p + P - 1 \leq KN + 2^\alpha - N$$

and in that it comprises multiplexers able to make these K registers recirculating $N-1$ times out of N and circulating 1 time out of N, these multiplexers being controlled by the outputs of the counter.

4 Claims, 9 Drawing Figures

DISTRIBUTED ARITHMETIC OVERSAMPLING RECURSIVE DIGITAL FILTER

BACKGROUND OF THE INVENTION

The present invention relates to a distributed arithmetic oversampling recursive digital filter. In general terms, it is used in the processing of signals and more particularly in telecommunications.

In coding-decoding-filtering systems of the PCM type (pulse code modulation) operating by interpolative coding and digital filtering, undersampling and oversampling digital filters are used. These are filters for which the sampling frequency of the input signals $f_E$ and that of the output signals $f_S$ are not identical. For undersampling we obtain $f_E > f_S$ and for oversampling $f_E < f_S$.

Figure 1:
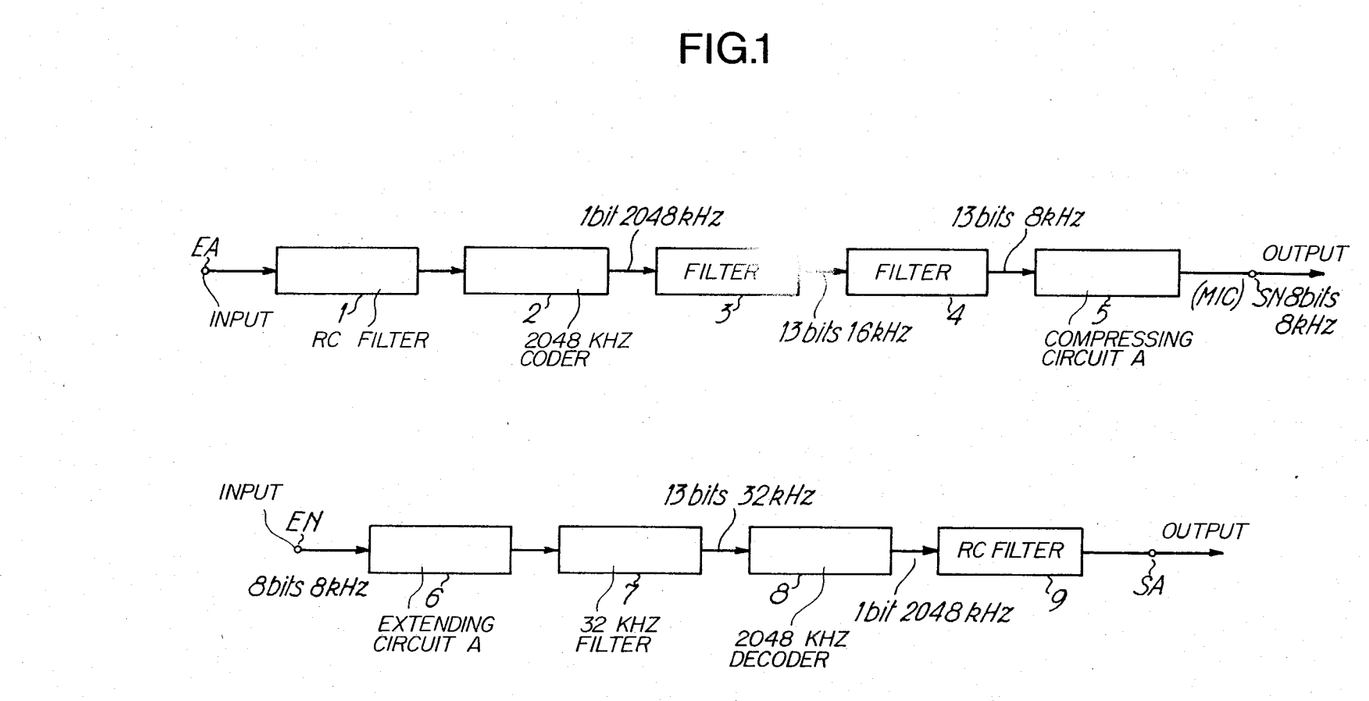
FIG. 1 shows the coding chain and decoding chain of a coding-decoding-filtering system of the PCM type.

FIG. 1 shows the organization of such systems. They comprise a coding chain and a decoding chain. The coding chain is constituted by an analog input EA, an RC type filter 1, a double integration delta-sigma coder 2 operating for example at 2048 kHz and supplying one-bit signals at 2048 kHz, a triangular undersampling digital filter 3 supplying 13-bit signals at 16 kHz, and undersampling digital filter 4 supplying 13-bit signals at 8 kHz, a circuit 5 for compressing the linear law into law A, whose digital output SN supplies 8-bit signals at 8 kHz. In a symmetrical manner, the decoding chain comprises a digital input EN, a circuit 6 for extending law A towards the linear law, an oversampling digital filter 7 operating at 32 kHz and supplying 13-bit signals at 32 kHz, a double integration delta-sigma decoder 8 operating at 2048 KHz and supplying 1-bit signals at this frequency and finally an RC type filter 9, whose output SA supplies the restored analog signal. Naturally, the digital values given are only of an exemplary nature.

French Patent Application 79 18862 filed on July 20, 1979 and entitled "Analog double integration delta-sigma coder and digital double integration delta-sigma decoder" in particular describes circuits 2 and 8.

The specification applicable to such systems appears in report G712 of the CCITT, orange book, Vol. III-2, entitled "Quality characteristics of PCM channels at voice frequencies".

Recently, projects have been launched dealing with systems of this type having to comply with much stricter specifications than that of the aforementioned report G712, particularly with regard to the filters on transmission and reception. In order to satisfy the templates appropriate for said filters, it is necessary to use the recursive digital filtering procedure in which the output signals of the filter are reinjected at the input thereof.

In the article by G. D. TATTERSALL and M. J. CAREY entitled "Digital bandlimiting filters for PCM transmission systems" published in the Journal "IEEE Transactions on Communications", Vol. COM-27, No. 1, January 1979, pp. 240-1246, the realization of such recursive filters by using a method commonly called "distributed arithmetic" is proposed.

The present invention again takes up the idea of the distributed arithmetic recursive filter, but provides an improvement in that by a careful adaptation of the circuits inherent in distributed arithmetic and circuits which permit oversampling, it is possible to bring about a by no means negligible saving as regards the means used (particularly the number of input registers) whilst retaining a very considerable flexibility of use.

Recursive digital filtering is conventionally characterized by an expression of the following form:

$$y_n = \sum_{k=0}^{p} a_k x_{n-k} - \sum_{k=1}^{q} b_k y_{n-k} \quad (1)$$

in which $x_{n-k}$ designates the input signals of rank $n-k$, $y_{n-k}$ output signals of rank $n-k$ reinjected at the input of the filters, $a_k$ coefficients of the non-recursive part, whose order is p, and $b_k$ coefficients of the recursive part, whose order is q, n assuming whole values and characterizing the output signal.

Expression (1) is a particular case of a more general expression expressing a weighted sum which can be expressed by:

$$v = \sum_{k=1}^{p} a_k u_k \quad (2)$$

A recursive digital filter comprises p+1 inputs receiving signals $x_k$ and q inputs receiving signals $y_k$, i.e., in all, p+q+1 inputs. It also comprises an output supplying the sequence of signals $y_n$.

The transfer function H(z) of such a filter expressed by means of the complex variable z is:

$$H(z) = \frac{\sum_{k=0}^{p} a_k z^{-k}}{1 + \sum_{k=1}^{q} b_k z^{-k}} \quad (3)$$

The invention relates to a special digital processing method called "distributed arithmetic". The latter is described in U.S. Pat. No. 3,777,130 granted on Dec. 4, 1973, to A. CROISIER, D. J. ESTEBAN, M. E. LEVILION and V. RISO, entitled "Digital filter for PCM encoded signals" as well as in the article by A. PELED and B. LIU entitled "A new hardware realization of digital filters" published in the Journal "IEEE Trans. on ASSP," Vol. ASSP-22, pp.456-462, December 1974. In addition, the article by C. S. BURRUS entitled "Digital filter structures described by distributed arithmetic" published in the Journal "IEEE Trans. on Circuits and Systems", Vol. CAS-24, No. 12, December 1977, pp.674-680, provides a general approach to this question and describes a number of algorithms and structures which can be used. Reference can be made to these documents for details concerning the distributed arithmetic method, which is only described briefly hereinafter in order to facilitate the understanding of the invention.

SUMMARY OF THE INVENTION

The invention consists of forming a weighted sum of the signals expressed by the relation (2). It is assumed that $u_k$ are coded on r bits in code complement 2, but naturally other codes are also possible. The sign bit is designated $u_k(0)$ and the bits representing the absolute value of $u_k$ are designated $u_k(j)$, j being between 0 (exclusive) and r−1 (inclusive). It is then possible to write:

$$u_k = -u_k(O)2^0 + \sum_{j=1}^{r-1} u_k(j) 2^{-j}$$

if $-1 < u_k < 1$.

Then, after inverting the summations, it is possible to write v in the form:

$$v = -2^0 \left( \sum_{k=1}^{p} u_k(0)a_k \right) + \sum_{j=1}^{r-1} 2^{-j} \left( \sum_{k=1}^{p} u_k(j)a_k \right)$$

In this relation, the term $u_k(j)$ appearing in the expression in brackets is the bit of rank j of $u_k$ and this bit can only assume the two values 0 or 1. Thus, there are only two possible values, i.e., 0 or $a_1$ for the first product $u_1(j)a_1$. In the same way, the product $u_2(j)a_2$ can only assume the two values 0 and $a_2$. Thus, there are only four possible values for the sum of these two products, namely 0, $a_1$, $a_2$ or $a_1+a_2$. Step by step, it is possible to see that there are finally two possible values for the sum:

$$\sum_{k=1}^{p} u_k(j)a_k.$$

This sum, which will be designated $w_j$ (because it is dependent on the rank j in question), thus assumes any one of the two p values determined solely by the coefficients $a_k$. Thus, the calculation of the weighted sum involves the calculation of the expression:

$$v = -2^0 \cdot w_0 + \sum_{j=1}^{r-1} w_j 2^{-j}$$

in which the $w_j$ can be predetermined as soon as a set of coefficients $a_k$ has been fixed.

Whichever of these $2^p$ values is to be retained for forming $w_j$, is defined by the group of p bits of rank j of the input signals, namely $u_1(j), u_2(j) \ldots u_p(j)$.

In a distributed arithmetic processing circuit the quantities $w_j$ are entered in a memory of $2^p$ words of m bits, if m is the number of bits necessary for expressing these partial sums. The word corresponding to a particular $w_j$ is located in said memory at the address corresponding to the p bits of rank j of input signals $u_k$.

The number m is determined on the basis of the constraints of the problem to be dealt with and can be deduced in two different ways, namely by truncating coefficients $a_k$ as in a conventional realization or by direct truncation of the quantities $w_j$ (but then processing is no longer strictly linear). The latter method is described in the article by R. LAGADEC and D. PELLONI entitled "A model for distributed arithmetic for filters with post-quantized look-up table" published in "National Telecommunications Conference," 1977, pp.29: 3-1 to 29: 3-6.

If the input signals $u_k$ are introduced into series registers with a low head weight and if at the output of the memory containing the precalculated $w_j$ is positioned an arithmetic unit comprising an adder-subtractor, an accumulator register with parallel inputs and parallel outputs which can be shifted, it is possible to obtain the weighted sum v in r elementary operations such as the reading of the memory at the address given by the p bits $u_k(j)$, addition of the content of the parallel-parallel accumulator register and the word contained in the memory at the indicated address (for j=0 it is necessary to subtract the content of the memory from the content of the register), and shifting the parallel-parallel accumulator register and the series input registers (corresponding to a division by 2 of the intermediate result).

Figure 2:
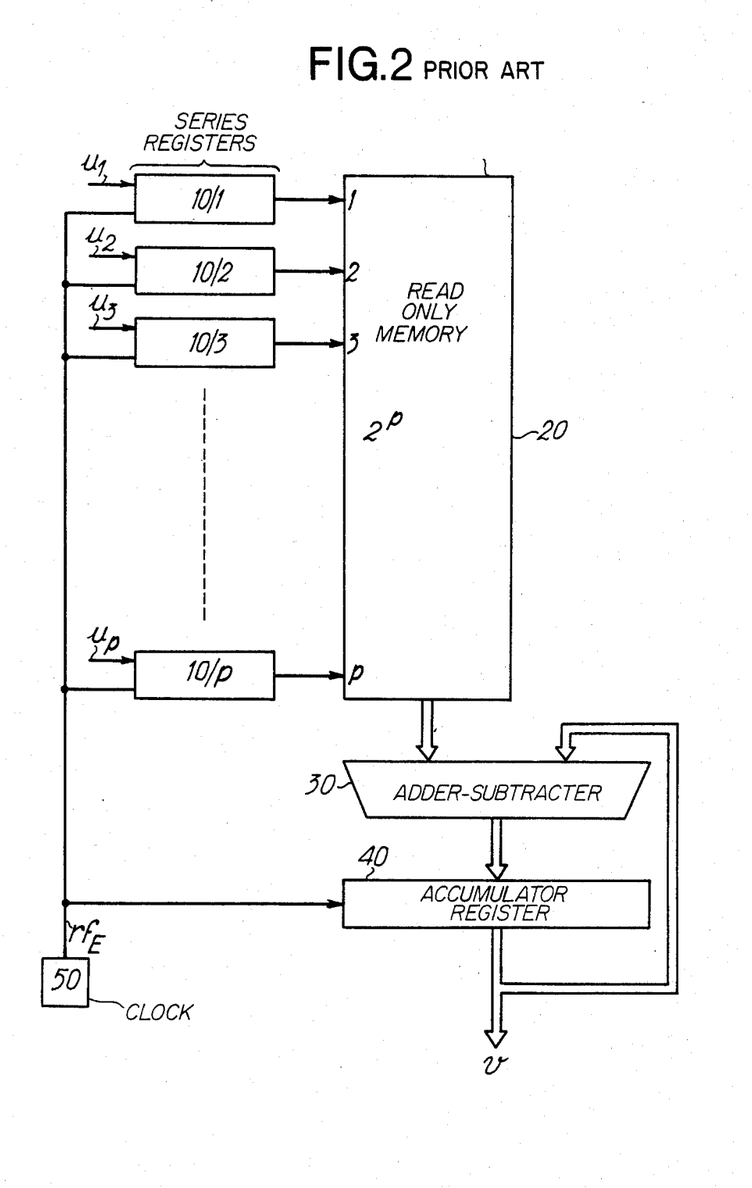
FIG. 2 shows a prior art embodiment of a distributed arithmetic processing circuit.

The material organization of such a circuit is illustrated in FIG. 2. The represented circuit comprises p series registers 10/1, 10/2 . . . 10/p of r bits receiving the p input signals, a read-only memory 20 of $2^p$ words of m bits, an adder-subtractor 30, a register 40 with parallel inputs and parallel outputs which can be shifted and a timing circuit or clock 50.

The memory has p inputs connected to the outputs of the p input registers and contains the $2^p$ following quantities:

$$\sum_{k=1}^{p} a_k \epsilon_k$$

in which $\epsilon_k$ assumes the values 0 or 1, the address of each quantity being constituted by p bits applied to the p inputs.

With such means, in r clock strokes the equivalent of p multiplications and (p−1) additions is performed, the operations being performed in the following manner.

The quantities $u_k$ have a low head weight in registers 10/1 . . . 10/p. The first calculated quantity is:

$$w_{r-1} = \sum_{k=1}^{p} u_k(r-1)a_k$$

then, after shifting the register 40, we calculate: $2^{-1} w_{r-1}$, $w_{r-2}$, then the sum $w_{r-2}+2^{-1}w_{r-1}$, then after a further shift, $$2^{-1}(w_{r-2}+2^{-1}w_{r-1})=2^{-1}w_{r-2}+2^{-2}w_{r-1}$$

and so on up to the n-th clock stroke, where it is necessary to carry out a subtraction corresponding to the sign bits $u_k(0)$. After this final stroke, the series registers 10/1 . . . 10/p must be shifted. It is also possible to truncate or round off the result v. To carry out the truncation, it is sufficient not to take account of the low weight bits as from a certain moment. For rounding off purposes, it is necessary to add, after truncating the results, a low half-weight.

Figure 3:
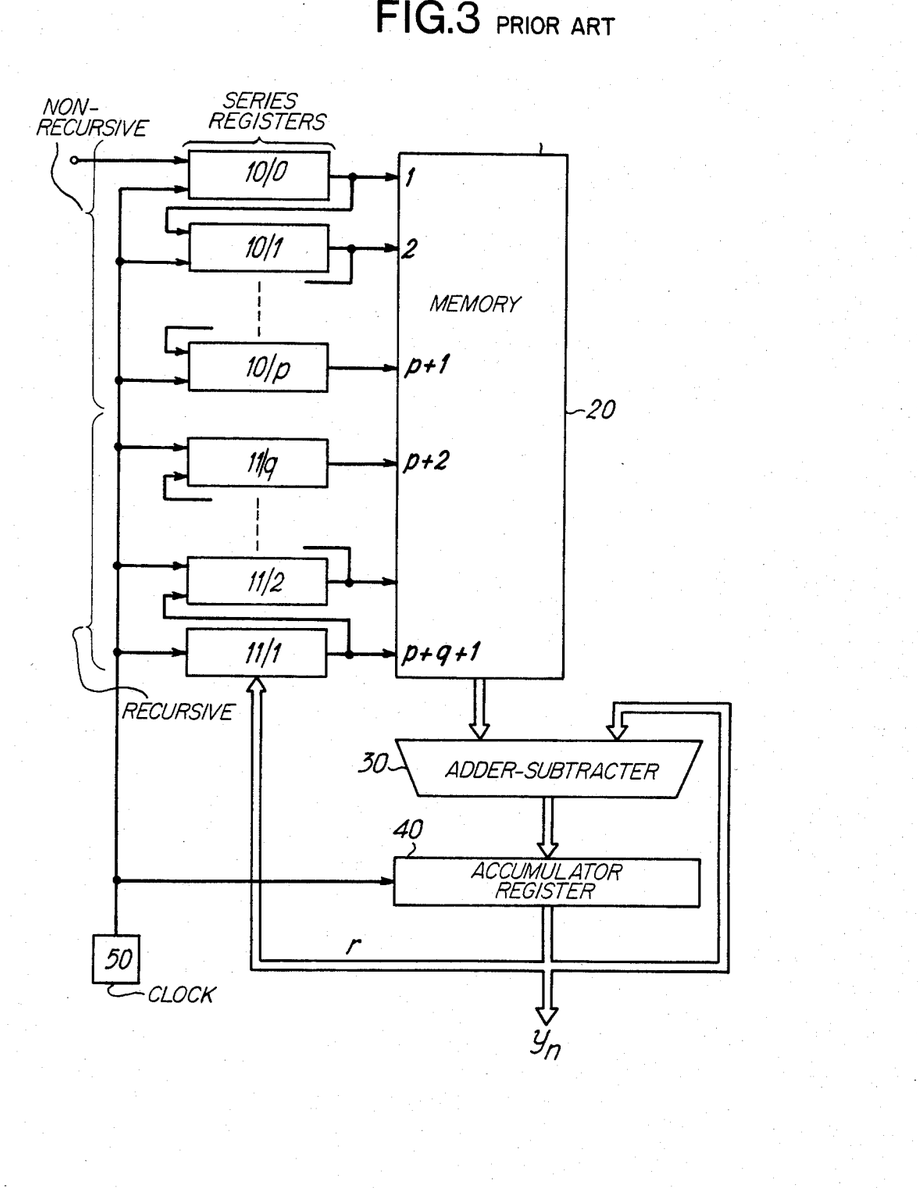
FIG. 3 shows a prior art embodiment of a recursive digital filter.

These principles can be applied to the realization of a recursive digital filter. The operation to be performed is then in accordance with relation (1) and the corresponding circuit is that of FIG. 3. It comprises a non-recursive part constituted by p+1 series registers 10/0, 10/1 . . . 10/p receiving the signals $x_n, x_{n-1} \ldots x_{n-p}$ and a recursive part constituted by q registers 11/1, 11/2 . . . 11/q receiving the signals $y_{n-1}, y_{n-2} \ldots y_{n-q}$ register 11/1 having parallel loading and the other registers series loading. The output of registers 10/0 to 10/p−1 is connected to the input of the following register, in the same way as registers 11/1 to 11/q−1. The circuit then comprises a memory 20 with p+q+1 inputs connected to the output of the registers, said memory containing $2^{p+q+1}$ words of m bits, said words being the quantities:

$$\sum_{j=0}^{p} a_j \epsilon_{j+1} - \sum_{k=1}^{q} b_k \epsilon_{p+q+2-k}$$

in which $\epsilon_j$ are equal to 0 or 1, j passing from 1 to p+q+1.

Finally, the circuit comprises the aforementioned arithmetic processing members, namely an adder-subtractor 30, an accumulator register 40 with parallel inputs and parallel outputs, and a clock 50 ensuring the appropriate performance of the operations (shift of registers, loading of parallel registers, resetting of the accumulator at the end of the cycle).

There are two modifications compared with FIG. 2:

register 11/1 corresponding to $y_{n-1}$ has parallel loading and the content of the parallel-parallel register 40 must be limited to r bits (by truncating or rounding off) and then, at the end of each cycle of calculations (r elementary operations), loaded into register $y_{n-1}$ in a parallel manner, the different series registers are interconnected.

The invention is based on a certain number of properties exhibited by recursive filters when using distributed arithmetic. These properties have can be summarized as follows.

In an oversampling recursive filter, the output signals $y_n$ are sampled at a frequency n times higher than the input signals $x_n$. The calculation of the expression:

$$y_n = \sum_{k=0}^{p} a_k x_{n-k} - \sum_{k=1}^{q} b_k y_{n-k} \quad (1)$$

then has special features, because the samples $x_{n-k}$ will be zero (N−1) times out of N, whilst the samples $y_{n-k}$ will always be present. To further define this point, it should be noted that the running index n has the form n=tN+j, showing the multiplicity compared with N and in which the index j assumes all values between 0 (inclusive) and N−1 (inclusive).

When j=0, index n is a multiple of N. When k assumes all values between 0 and p, the first summation involves the coefficients $a_0, a_1, a_2 \ldots a_p$ and the samples $x_{tN}, x_{tN-1}, x_{tN-2} \ldots$ However, among these samples, only those whose rank is a whole multiple of N are not zero, namely $x_{tN}, x_{tN-N}, x_{tN-2N} \ldots$ Thus, the first summation only involves certain of these products. For example, for N=4, the summation only contains the terms $a_0 x_{t4}, a_4 x_{t4-4} \ldots$ In other words, everything takes place as if it were an ordinary filter with the set of coefficients $a_0, a_4 \ldots$ (whereby the index naturally may not exceed the order p of the non-recursive part).

For the following rank n we have j=1 and the samples involved in the first summation are, on this occasion, $x_{tN+1}, x_{tN}, x_{tN-1}$, etc. On this occasion, it is the second sample $x_{tN}$, the fifth, etc. which are not zero. The products to be taken into account are therefore on this occasion (and always in the case when N=4) $a_1 x_{t4}$, $a_5 x_{t4-N} \ldots$ Thus, the set of coefficients involved is $a_1$, $a_5 \ldots$ For the following index n obtained for j=2 it is found in the same way that the set of coefficients involved is $a_2, a_6 \ldots$ Finally, for the index n obtained with j=3, the set of coefficients is $a_3, a_7 \ldots$ For the following value of n we obtain j=0 again with t increased by one unit and the four aforementioned sets of coefficients ($a_0, a_4$), ($a_1, a_5$).

Table I gives the different input samples $x_{n-k}$ (the non-zero samples being underlined) in the case where the oversampling factor N is equal to 4 for the four values of j. This example corresponds to the case illustrated in FIG. 1, where the sampling frequencies are respectively equal to 32 kHz and 8 kHz at the output and input. In this table, the order p of the non-recursive part is equal to 6 (leading to a summation on 7 terms from k=0 to k=6). The sets of coefficients to be taken into consideration for each value of j (therefore, of n) are indicated at the bottom of each column. There are four different sets and in general terms N.

Moreover, in this example there is a maximum of 2 non-zero samples involved in a summation can k for a fixed n. Naturally, this number is dependent on the order p: the higher the order p is, number of samples which may not be zero increases. In the example of Table I, p=7 could be used without increasing the number of non-zero samples involved in the summation.

The order p is still between two successive multiples of N designated (K−1)N and KN with possible equality for the first. In the special case corresponding to p=6 and N=4, we consequently obtain K=2 (6 is between 1×4 and 2×4). It is easy to see that the number of samples to be taken into account in the summation of K of the non-recursive part is in general terms at most equal to K.

Thus, according to one of the features of the present invention, the number of series registers receiving the input signals and constituting the non-recursive part of order p is limited to K, K being defined (in the case where $N=2^\alpha$) by:

$$(K-1)N \leq p < KN \quad (4)$$

In the prior art, the number of registers used was taken as equal to p+1, as illustrated in FIG. 3.

According to another feature of the filter according to the invention, the N different sets of coefficients which are to be used in turn when rank n varies (in the example of Table I: ($a_0, a_4$), ($a_1, a_5$), ($a_2, a_6$), ($a_3$)) are stored in N (in this case 4) blocks of the memory, said blocks having the same size and being addressed in turn in accordance with the value of N. This addressing is obtained by a modulo N counter which receives the control pulses at frequency $f_S$ and whose outputs are connected to the addressing inputs of the memory. When N is between $2^{\alpha-1}$ (exclusive) and $2^\alpha$ (inclusive), the counter in question comprises $\alpha$ outputs and the memory comprises $\alpha$ addressing inputs of the N memory blocks. Moreover, said memory must comprise K inputs corresponding to the K series registers of the non-recursive part and also q inputs corresponding to the q registers of the ordinary recursive part. Thus, definitively the memory has $\alpha + K + q$ addressing inputs and a capacity of $2^{\alpha+K+q}$ words of m bits.

This second characteristic stresses the second saving of means resulting from the invention. In the prior art, the memory associated with a recursive part of order p and a non-recursive part of order q must have a capacity of $2^{p+q+1}$ words. Thus, with regard to the memory size, the gain resulting from the invention is in general:

$$2^{p+q+1}/2^{\alpha+K+q}$$

In the most favorable case where p=KN−1 and $N=2^\alpha$, this gain is $2^{K(N-1)}/N$, this quantity exceeding 1 as soon as $N \geq 2$ and $K > 1$.

In the most favorable case corresponding to p=(K−1)N and $N=2^{\alpha-1}-1$, the gain is $2^{K(N-1)-N}/N-1$, this quantity exceeding 1 as soon as $N \geq 2$ and $K \geq 2$.

In the case where N is not a power of 2, expression (4) assumes a different form:

$$(K-1)N + 2^\alpha - N \leq P < KN + 2^\alpha - N \quad (5)$$

and when the signals are repeated P times out of N, at the input it assumes the following most general form:

$$(K-1)N+2^\alpha-N \leq p+P-1 < KN+2^\alpha-N \qquad (6)$$

Specifically, the invention can be defined in the following way. It relates to a distributed arithmetic oversampling recursive digital filter comprising a recursive part of order q constituted by a register with parallel loading and q−1 series registers, this q registers being of a circulating nature, i.e., connected in cascade; a non-recursive part of order p constituted by series registers; a memory divided into N memory blocks each containing a set of three calculated quantities characterizing the filtering to be carried out; a modulo N counter with $\alpha$ outputs, the memory having, on the one hand; $\alpha$ addressing inputs of the different blocks connected to the $\alpha$ outputs of the counter and, on the other hand, addressing inputs within a block connected to the outputs of the registers of the recursive and non-recursive parts; an adder-subtractor connected to the memory; an accumulator register whose input is connected to the adder-subtractor and to the output of the parallel loading register and to the adder-subtractor, the input signals of the non-recursive part being blockable P times out of N; a frequency clock $f_S$ controlling the output of the signals of the parallel register and their inputs in the recursive part and actuating the counter, the shift frequency of the registers being $rf_S$ if r is the length common to the various series registers, the frequency $f_S$ being equal to $Nf_E$ in which N is an integer, $f_E$ the sampling frequency of the signals at the input of the filter and $f_S$ the input frequency of the filter, characterized in that the non-recursive part only comprises K series registers, K being an integer defined by the double inequality:

$$(K-1)N+2^\alpha-N \leq p+P-1 < KN+2^\alpha-N$$

and in that it comprises switching means able to make these K registers recirculating, i.e., looped onto themselves, N−1 times out of N and circulating, i.e., interconnected in cascade, time out of N, these switching means being controlled by the outputs of the counter.

Preferably, the switching means are constituted by K multiplexers with two signal inputs and one output and a control input connected to the counter.

Preferably, multiplexers can be inserted between the memory and the registers in order to reduce the size of the memory.

Preferably, when N is not a power of 2, i.e., when N differs from $2^\alpha$, the invention provides a multiplexing of certain input registers with the outputs of the counter, making it possible to optimize the use of the memory.

BRIEF DESCRIPTION OF THE DRAWINGS

The features and advantages of the invention will appear more clearly from the following description of illustrative and non-limitative embodiments. This description refers to the attached drawings, following those which have already been described and wherein.

DESCRIPTION OF THE PREFERRED EMBODIMENTS

Figure 4:
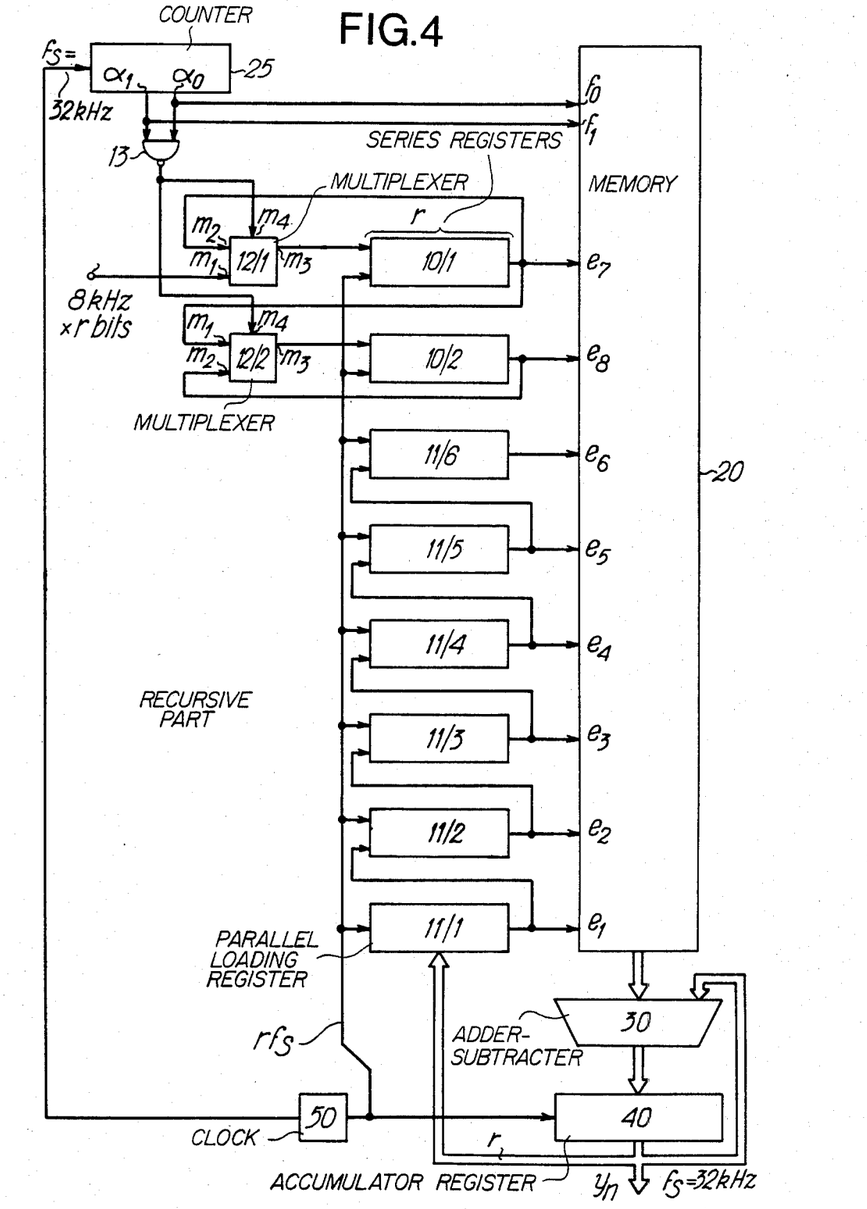
FIG. 4 shows an embodiment of an oversampling recursive filter according to the invention in the special case where the non-recursive part comprises two series registers (K=2) and the recursive part six series registers.

FIG. 4 shows an example of the filter according to the invention corresponding to the case where the order q of the recursive part is equal to 6 and where the order p of the non-recursive part is equal to 7 and in which N=4, said conditions leading to K=2 and $\alpha$=2.

The filter comprises a recursive part constituted by a parallel loading register 11/1 and 5 series registers 11/2, 11/3 ... 11/6, all of these registers being circulating, i.e., connected in cascade to one another, and a non-recursive part constituted by two series registers 10/1 and 10/2, each associated with a multiplexer having two inputs 12/1 and 12/2. The filter also comprises a memory 20 divided into four memory blocks of the same size, each containing a set of precalculated quantities characteristics of the filtering to be performed and a modulo 4 counter 25 with two outputs $\alpha_0$ and $\alpha_1$. Memory 20 has, on the one hand, two addressing inputs $f_0$, $f_1$ of four blocks, these inputs being connected to the two outputs of the counter and said on the other hand 8, addressing inputs $e_1$, $e_2$ ... $e_8$ of one word within a block, these inputs being connected to the outputs of 8 registers of the recursive and non-recursive parts. The filter also comprises in a known manner an adder-subtractor 30 and an accumulator register 40, whose output is connected to the parallel loading register 11/1. Finally, a clock 50 actuates the registers of the non-recursive and recursive parts at frequency $rf_S$ (in each case, r is the number of bits of the processed signal as well as counter 25 and the parallel loading of register 11/1 at frequency $f_S$.

The switching means which are able to make the two registers 10/1 and 10/2 recirculating, i.e., looped on themselves three times out of four, and circulating, i.e., interconnected in cascade once out of four, are constituted by the two multiplexers 12/1 and 12/2 and by the NAND gate 13 with two inputs connected to the outputs $\alpha_0$ and $\alpha_1$ of counter 25. Each multiplexer has two signal inputs $m_1$ and $m_2$, an output $m_3$ and a control input $m_4$. The second input $m_2$ of each multiplexer is connected to the output of the series register with which it is associated, the first input $m_1$ being connected to the output of the preceding register, except in the case of the first 12/1, whose input is connected to a general input of the signals to be processed. The control input of the multiplexers is connected to the output of the NAND gate. It is therefore at state 0 only when the two outputs $\alpha_0$ and $\alpha_1$ are at 1 or in other words when the counter content is at its maximum (N−1 on counting from 0 to N−1, N on counting from 1 to N). The output m₃ of each multiplexer is then connected to the first input m₁, making the two registers 10/1 and 10/2 circulating. In the three other cases, the output of the NAND gate is at 1 and output m₃ is connected to the second input m₂, which makes the two registers recirculating.

In the illustrated embodiment, the capacity of the memory is $2^{2+2+6}=2^{10}$, i.e., 1024 words instead of $2^{6+6+1}=2^{13}$, i.e., 8192 words, as in the prior art, giving a gain of 8 on the memory size.

The arrangements described hereinbefore can easily be modified if the input signals are repeated (or blocked) at the filter input in accordance with a known procedure. If the signals at the input of a filter are repeated P times out of 10, the signal undergoes complementary filtering of the following transfer function:

$$G_p(f) = \left| \frac{\sin \pi P f/f_S}{\sin \pi f/f_S} \right| \quad (7)$$

which must be corrected in passband, but whose out-of-band attenuation (in particular, the zeros at $f=kf_S/P$) can facilitate the synthesis of a filter satisfying a given template. The hitherto considered case corresponds to P=1 and consequently there is then no parasitic transfer function ($G_1(f)=1$).

On repeating the input samples P times out of N to find the power of the input signal at the output, it is necessary to multiply the input samples of N/P (or multiply the coefficients of the non-recursive part by N=P). When P=N (case known under the name "zero-order blocker"), this multiplicative factor is equal to 1 and the transfer function is:

$$G_N(f) = \left| \frac{\sin \pi N f/f_s}{\sin \pi f/f_s} \right| \quad (8)$$

If the input signals are blocked, the number of $x_{n-k}$ to be taken into consideration in the summation on k increases and consequently so does the number of coefficients $a_k$ involved in each set. Table II gives the case envisaged in Table I when the signals are blocked 2 times out of 4. It can be seen that when j=0 (first column) the sample of rank k=3 is no longer zero, because it corresponds to $x_{tN-4}$ repeated. Thus, the coefficients involved in the summation for j=0 are no longer $a_0$ and $a_4$ and are instead $a_0$ and $(a_3+a_4)$. This also applies for j=1, where it is necessary to retain the set of coefficients $(a_0,a_1), (a_4+a_5)$, etc . . . , In general terms, it can be demonstrated that the N sets of coefficients to be taken into consideration on repeating the input signals P times out of N are as follows:

for $j = 0$: $a_o$, $\sum_{k=N+1-P}^{N} a_k$, $\sum_{k=2N+1-P}^{2N} a_k, \ldots$ for $j = 1$: $a_o + a_1$, $\sum_{k=N+2-P}^{N+1} a_k$, $\sum_{k=2N+2-P}^{2N+1} a_k, \ldots$ for $j = P$: $\sum_{k=1}^{P} a_k$, $\sum_{k=N+1}^{N+P} a_k$, $\sum_{k=2N+1}^{2N+P} a_k, \ldots$ -continued for $j = N - 1$: $\sum_{k=N-P}^{N-1} a_k$, $\sum_{k=2N-P}^{2N-1} a_k$, $\sum_{k=3N-P}^{3N-1} a_k \ldots$ On making P=1 the results of Table I are obtained and on making P=2 the results of Table II are obtained.

Thus, this modification affects the precalculated quantities to be introduced into memory 20. Moreover, the number K of registers to be used at the input is defined by the double inequality:

$$(K-1)N \leq p+p-1 < KN \quad (9)$$

The aforementioned arrangements make it possible to reduce the memory size. This size can be further reduced on placing the multiplexers between the memory and the registers at the cost of a multiplication of the calculation frequency by M, if M is the multiplexing factor. Naturally, precautions must be taken so that when an input $x_{n-k}$ is addressed to the memory, that part of the memory containing the set of coefficients to be used is correctly addressed, which assumes that the α inputs of the memory corresponding to the addressing of the blocks receive the bits supplied by the modulo N counter.

The two possible solutions are either to only effect multiplexing on the (K+q) inputs of the memory connected to the registers or to repeat, if necessary, the α bits obtained at the output of the counter in such a way that for each $x_{n-k}$ selected by a multiplexer, the α bits of the counter are also selected.

Figure 5:
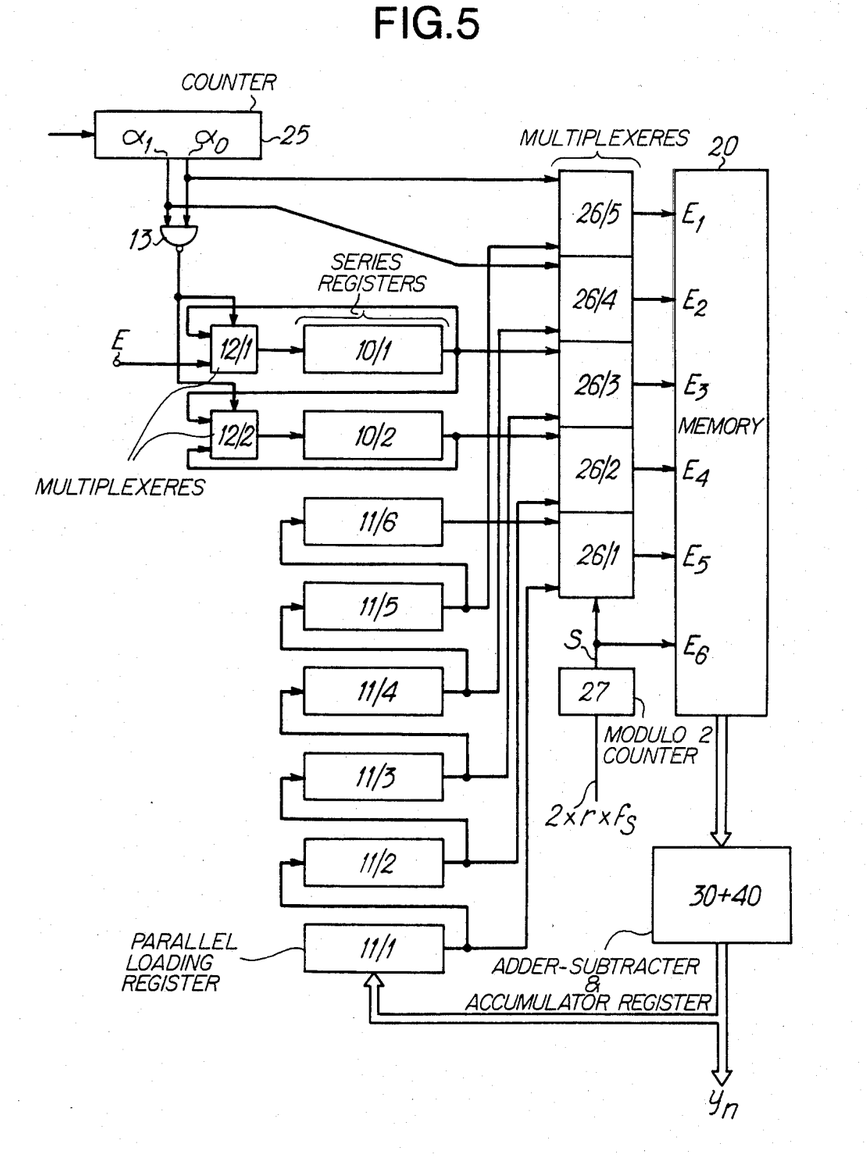
FIG. 5 shows a constructional variant of the above filter using multiplexers with two inputs located between the registers and the memory.

FIG. 5 illustrates the case where 5 multiplexers 26/1 to 26/5 with M=2 inputs and one output are positioned between memory 20, on the one hand, and the registers and counter 25, on the other, in an embodiment corresponding to the case illustrated in FIG. 4. These multiplexers are controlled by a modulo 2 counter 27 working at the frequency $2rf_S$ and which supplies a bit S equal to 0 or 1. Memory 20 then has 6 inputs, respectively, $E_1$ to $E_6$. When S is at 0, these inputs are respectively connected to $a_0$, $a_1$, 10/1, 10/2, 11/6 and 27. When S is at 1, they are connected to 11/5, 11/4, 11/3, 11/2, 11/1 and 27. Thus, the memory size is only $2^6=64$ words of m bits, i.e., a reduction by a factor of 16 compared with the case of FIG. 4.

Figure 6:
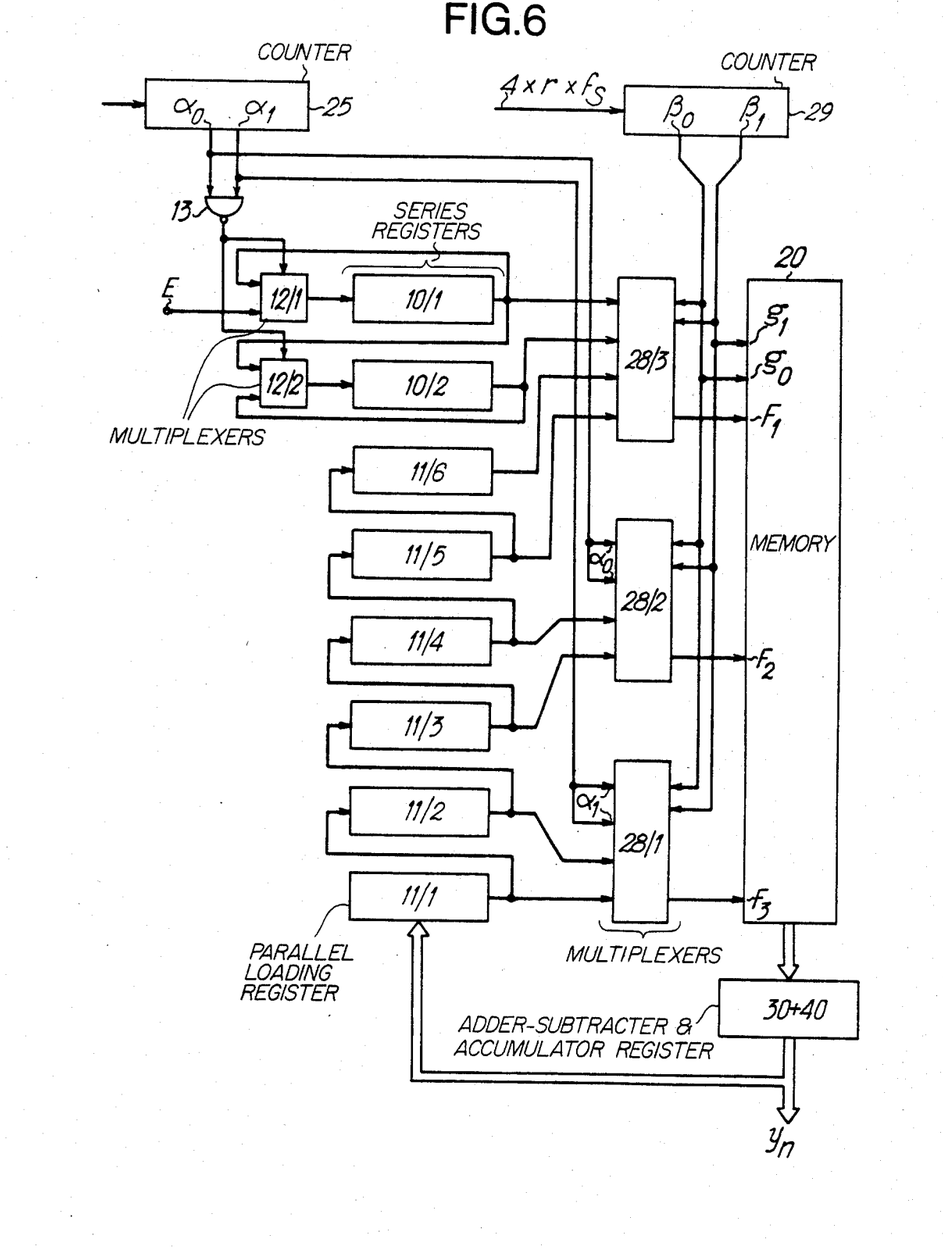
FIG. 6 another variant of the aforementioned filter using multiplexers with four inputs.

FIG. 6 shows another example of the use of multiplexers, on this occasion with M=4 inputs. Three multiplexers 28/1, 28/2 and 28/3 are controlled by a modulo 4 counter 29 with two outputs $\beta_0$ and $\beta_1$. The memory comprises 2 inputs $g_0$ and $g_1$ connected to the outputs of the modulo 4 counter 29 and three inputs $F_1$, $F_2$, $F_3$. The correspondence between the bits supplied by counter 29 and the elements to which the three inputs $F_1$ to $F_3$ are connected is as follows:

| $\beta_0$ | $\beta_1$ | Input $F_1$ connected to | Input $F_2$ connected to | Input $F_3$ connected to |
|---|---|---|---|---|
| 0 | 0 | 10/1 | $a_0$ | $a_1$ |
| 0 | 1 | 10/2 | $a_0$ | $a_1$ |
| 1 | 0 | 11/6 | 11/4 | 11/2 |
| 1 | 1 | 11/5 | 11/3 | 11/1 |

Thus, the size of the memory is only $2^5=32$ words of M bits.

In the above description, the oversampling factor N is assumed to be a power of 2 ($N=2^\alpha$). In the case where this condition is not satisfied, the invention provides for a special arrangement making it possible to optimize the filling of the memory.

This variant of the invention is based on the following comments. The content of the counter varies between 0 and $N-1$ (a similar reasoning would apply if the content varied between 1 and N). The binary configuration supplied by the $\alpha$ outputs of the counter and corresponding to N, $N+1$, $2^\alpha-1$ are consequently never reached. This means that certain configurations between 0 and $N-1$ will be entirely characterized by a number of bits strictly below $\alpha$. In other words, among the $\alpha$ bits supplied by the counter some may not be significant, i.e., may have an influence on the memory addressing control.

For example, for $N=3$ counter 25 counts from 0 to 2. The binary configuration supplied by its outputs are therefore as follows:

| $\alpha_1$ | $\alpha_0$ |
|---|---|
| 0 | 0 |
| 0 | 1 |
| 1 | 0 |

Binary configuration 11 is never produced because the counter content does not reach 3. Thus, if $\alpha_1$ is at 1, the least significant bit $\alpha_0$ lacks significance because in itself $\alpha_1=1$ is sufficient for addressing one of the blocks of the memory, so that bit $\alpha_0$ is not involved in this addressing. Thus, one input of the memory can be freed when $\alpha_1=1$ and this input can be allocated to data, so that a double sized memory block can be formed. This switching operation can be brought about by a multiplexer.

In general terms, it is possible to demonstrate that a memory with $2^{\alpha+n}$ words can be subdivided into memory blocks of $2^n$ words and memory blocks of $2^{n+1}$ words, resulting from the equation:

$$2^{\alpha+n}=[N-(2^\alpha-N)]2^n+(2^\alpha-N)2^{n+1}$$

which can be directly demonstrated. In this equation, the term in square brackets proves the inequalities:

$$0<N-(2^\alpha-N)\leq 2^\alpha$$

and the term in parentheses proves the inequality, $2^\alpha-N\geq 0$ because $2^{\alpha-1}<N\leq 2^\alpha$. This means that the memory of $2^{\alpha+n}$ words can be subdivided into $N-(2^\alpha-N)$ blocks of size $2^n$ and into $(2^\alpha-N)$ blocks of size $2^{n+1}$. Thus, in general terms, it is possible to free $(2^\alpha-N)$ supplementary inputs.

Moreover, when N differs from $2^\alpha$, the sequence of samples involved in the summation of the non-recursive part has special features. The following Table III gives, as an example, the sequence of non-zero samples $x_k$ in the case where $N=3$ and where the order of the non-recursive part is equal to 6. The zero samples are not mentioned for simplification purposes.

The number of non-zero $x_k$ involved in the summation on k is equal to 2, except on one occasion when it is equal to 3. It is easy to see that in general terms the number of non-zero $x_k$ is equal to k or $K+1$ in which K is defined by the aforementioned inequality:

$$(K-1)N+2^\alpha-N\leq p<KN+2^\alpha-N \quad (6)$$

which only differs from the inequality (9) by the introduction of the terms $2^\alpha-N$, representing the variation between N and the power of 2 which is immediately obtained (if $N=2^\alpha$, this variation is zero and the first condition is satisfied). It can also be seen that the cases where the non-zero $x_k$ represent $K+1$ is precisely $2^\alpha-N$. For example, for $N=3$, we obtain $\alpha=2$, $2^\alpha-N=1$, $K=2$ and there is a case where the number of inputs to be taken into consideration is equal to $K+1=3$.

Table IV gives in the same way the sequence of sample $x_k$ involved for $N=5$ and $p=7$. We then obtain $\alpha=3$, $2^\alpha-N=3$, $K=1$ and there are $2^\alpha-N=3$ cases where the number of inputs to be taken into consideration is equal to $K+1=2$.

On comparing these considerations concerning the number of inputs to be taken into account with those concerning the nature of the binary configurations supplied by the counter, it is immediately apparent that the number of cases where it is necessary to use a supplementary register ($K+1$ registers instead of K) is precisely equal to the number of binary configurations supplied by the counter containing one non-significant bit. In Tables III and IV, the binary configuration supplied by the counter have been shown in the lower part in such a way that the configurations with non-significant bits (framed) face the cases where the number of non-zero $x_k$ is equal to $K+1$.

According to the invention, the memory is not then addressed at the same time with the bit which is liable to be non-significant and with the content of the supplementary register and is instead addressed with either the first (when it is significant) or the second (when the bit in question is not significant), making it possible to optimize the use of this memory.

This variant is illustrated in FIG. 7 in the case where $N=3$, $\alpha=2$, and $K=2$, corresponding to Table III. From the point of view of the sampling frequencies, this is a question, for example, of the values 24 kHz and 8 kHz.

Figure 7A:
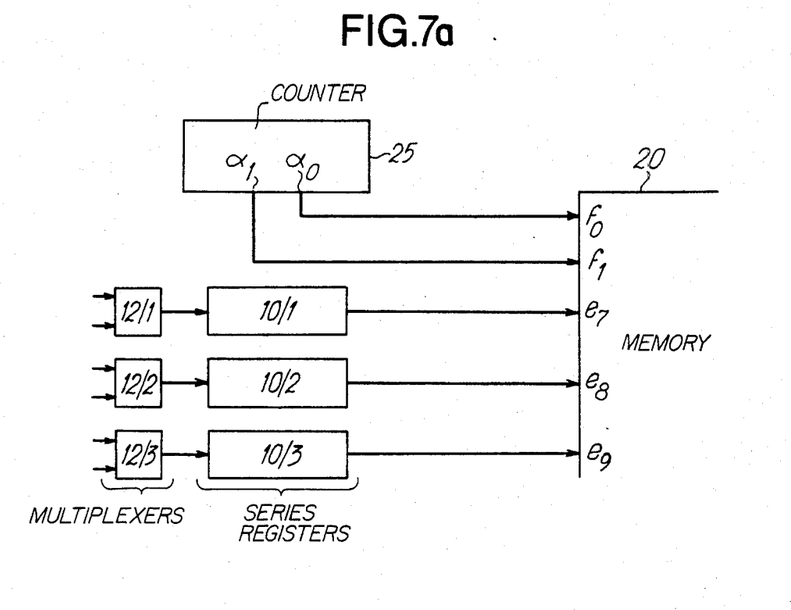
FIGS. 7 and 7a show a variant making it possible to optimize the filling of the memory when the oversampling factor is not a power of 2.
Figure 7B:
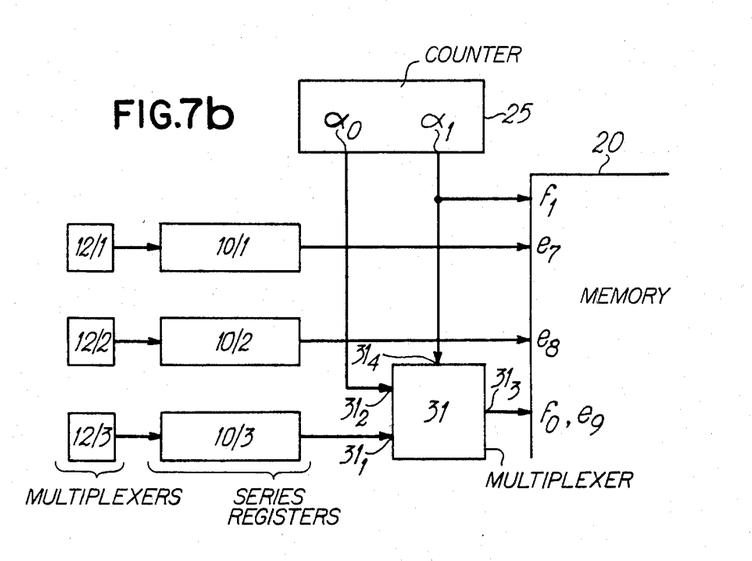

FIG. 7a shows the solution consisting of using three series registers 10/1, 10/2, 10/3 associated with their respective multiplexers 12/1, 12/2, 12/3 as described hereinbefore (the auxiliary means are not shown so as to simplify the drawings). These three registers are connected to three addressing inputs $e_7$, $e_8$ and $e_9$ of memory 20. In addition, the two outputs $\alpha_0$ and $\alpha_1$ of counter 25 are connected to the two memory inputs $f_0$ and $f_1$. As stated hereinbefore, when $\alpha_1$ is at 1, $\alpha_0$ is not significant, so that then the memory 20 is poorly used. To obviate this, the variant as shown in FIG. 7b is used, which differs from that of FIG. 7a by the addition of a multiplexer 31 having two inputs 31/1 and 32/2, an output 31/3, and a control input 31/4. Input 31/1 is connected to the supplementary series register 10/3, input 31/2 to output $\alpha_0$ of counter 25, output 21/3 to an input ($f_0/e_9$) of the memory, and control input 31/4 to the counter output $\alpha_1$. When $\alpha_1$ is at 1, it is input 31/1 which is connected to the output 31/3, and when $\alpha_1=0$ input 31/2 is connected to the same output. Thus, input ($f_0/e_9$) of the memory is connected either to the supplementary register 10/3 when bit $\alpha_0$ is not significant or to output $\alpha_0$ when the bit which it supplies is significant.

This arrangement can be used in the same way when the multiplexing factor M of the multiplexers (like 26/1 to 26/5 in FIG. 5 or 28/1 to 28/3 in FIG. 6) is not equal to a power of 2. In this case, those bits supplied by counter 29 which may not be significant are multiplexed with inputs connected to registers. For example, for multiplexers with 3 inputs ($M=3$) at the output of the modulo 3 counter a bit $\beta_0$ is obtained, which is not significant when $\beta_1 = 1$ and output $\beta_0$ can be multiplexed with one of the registers.

Figure 8:
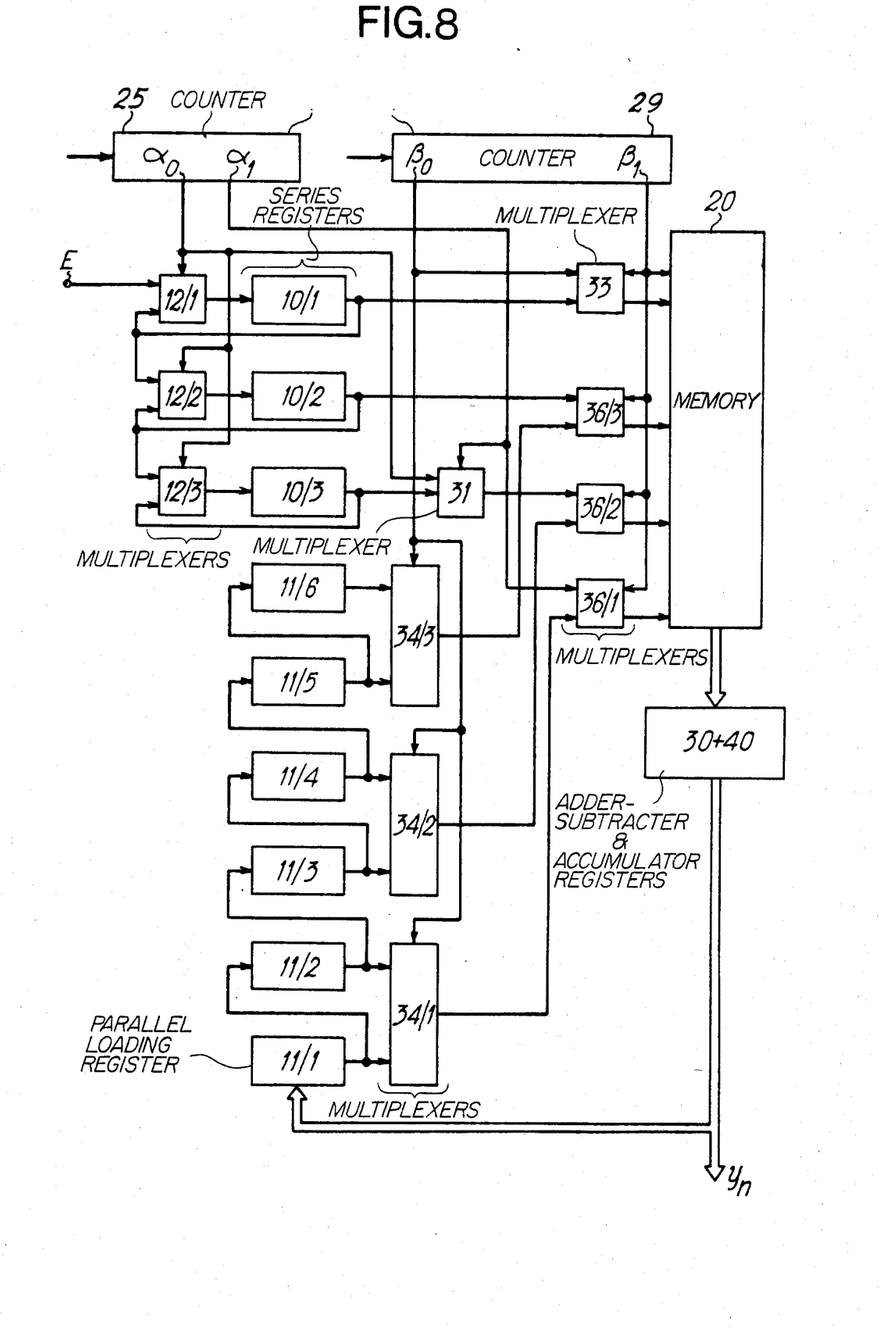
FIG. 8 shows another constructional variant of the above filter corresponding to the case when the oversampling factor N is not a power of 2 and when a supplementary register multiplexed with one of the outputs of the counter is used.

FIG. 8 illustrates the case where all these arrangements are combined in the case where M=N=3. Counters 25 and 29 are then modulo 3, and bits $\alpha_0$ and $\beta_0$ are not significant when $\alpha_1$ and $\beta_1$ are at 1. The multiplexers with three inputs are in reality obtained by two multiplexing stages with two inputs, respectively, 34/1, 34/2, 34/3 and 36/1, 36/2, 36/3. The multiplexer 33 with two inputs and one output makes it possible to multiplex the output of register 10/1 with the output $\beta_0$ of counter 29, which is not significant when $\beta_1 = 1$. Thus, in the illustrated case we have p=6 and q=6, i.e. K=2. Thus, there are K+1=3 series registers 10/1, 10/2, 10/3 containing the inputs $x_k$ and six registers 11/1 to 11/6 containing the outputs $y_n$. Register 10/3 is multiplexed by the least significant bit $\beta_0$ of counter 25. The convention adopted for the multiplexers is that already used, namely that the upper input is connected to the output when the control signal is at 1. The use of multiplexers 34/1, 34/2, 34/3, 33, 36/1, 36/2, 36/3 makes it possible to reduce the memory size from $2^{10} = 1024$ words of m bits to $2^5 = 32$ words of m bits. Without multiplexer 31 and without the multiplexers of the above list, the size of the memory would have been $2^{11} = 2048$ words of m bits. The use of multiplexers multiplies by 3 the calculating frequency.

These arrangements can also be combined with the case where the inputs are blocked P times out of N. It is then necessary to modify the relation defining K to:

$$(K-1)N + 2^\alpha - N \leq p + P - 1 < KN + 2^\alpha - N \quad (6)$$

TABLE I

| k | j = 0 | j = 1 | j = 2 | j = 3 |
|---|---|---|---|---|
| 0 | $x_{tN} \neq 0$ | $x_{tN+1} = 0$ | $x_{tN+2} = 0$ | $x_{tN+3} = 0$ |
| 1 | $x_{tN-1} = 0$ | $x_{tN} \neq 0$ | $x_{tN+1} = 0$ | $x_{tN+2} = 0$ |
| 2 | $x_{tN-2} = 0$ | $x_{tN-1} = 0$ | $x_{tN} \neq 0$ | $x_{tN+1} = 0$ |
| 3 | $x_{tN-3} = 0$ | $x_{tN-2} = 0$ | $x_{tN-1} = 0$ | $x_{tN} \neq 0$ |
| 4 | $x_{tN-4} \neq 0$ | $x_{tN-3} = 0$ | $x_{tN-2} = 0$ | $x_{tN-1} = 0$ |
| 5 | $x_{tN-5} = 0$ | $x_{tN-4} = 0$ | $x_{tN-3} \neq 0$ | $x_{tN-2} = 0$ |
| 6 | $x_{tN-6} = 0$ | $x_{tN-5} = 0$ | $x_{tN-4} \neq 0$ | $x_{tN-3} = 0$ |

TABLE I-continued

| k | j = 0 | j = 1 | j = 2 | j = 3 |
|---|---|---|---|---|
| coefficients | $a_0, a_4$ | $a_1, a_5$ | $a_2, a_6$ | $a_3$ |

TABLE II

| k | j = 0 | j = 1 | j = 2 | j = 3 |
|---|---|---|---|---|
| 0 | $x_{tN} \neq 0$ | $x_{tN+1} = x_{tN}$ | $x_{tN+2} = 0$ | $x_{tN+3} = 0$ |
| 1 | $x_{tN-1} = 0$ | $x_{tN} \neq 0$ | $x_{tN+1} = x_{tN}$ | $x_{tN+2} = 0$ |
| 2 | $x_{tN-2} = 0$ | $x_{tN-1} = 0$ | $x_{tN} \neq 0$ | $x_{tN+1} = x_{tN}$ |
| 3 | $x_{tN-3} = x_{tN-4}$ | $x_{tN-2} = 0$ | $x_{tN-1} = 0$ | $x_{tN} \neq 0$ |
| 4 | $x_{tN-4} \neq 0$ | $x_{tN-3} = x_{tN-4}$ | $x_{tN-2} = 0$ | $x_{tN-1} = 0$ |
| 5 | $x_{tN-5} = 0$ | $x_{tN-4} \neq 0$ | $x_{tN-3} = x_{tN-4}$ | $x_{tN-2} = 0$ |
| 6 | $x_{tN-6} = 0$ | $x_{tN-5} = 0$ | $x_{tN-4} \neq 0$ | $x_{tN-3} = x_{tN-4}$ |
| coefficients | $a_0, a_3 + a_4$ | $(a_0 + a_1), (a_4 + a_5)$ | $(a_1 + a_2), (a_5 + a_6)$ | $(a_2 + a_3), a_6$ |

TABLE III

| k | j = 0 | j = 1 | j = 2 |
|---|---|---|---|
| 0 | $x_{tN}$ | | |
| 1 | | $x_{tN}$ | |
| 2 | | | $x_{tN}$ |
| 3 | $x_{tN-3}$ | | |
| 4 | | $x_{tN-3}$ | |
| 5 | | | $x_{tN-3}$ |
| 6 | $x_{tN-6}$ | | |
| Number of non-zero $x_k$ | 3 | 2 | 2 |
| Binary configuration | 1 $\boxed{0}$ | 0 0 | 0 1 |

| k | j = 0 | j = 1 | j = 2 | j = 3 | j = 4 |
|---|---|---|---|---|---|
| 0 | $x_{tN}$ | | | | |
| 1 | | $x_{tN}$ | | | |
| 2 | | | $x_{tN}$ | | |
| 3 | | | | $x_{tN}$ | |
| 4 | | | | | $x_{tN}$ |
| 5 | $x_{tN-5}$ | | | | |
| 6 | | $x_{tN-5}$ | | | |
| 7 | | | $x_{tN-5}$ | | |
| Number of non-zero $x_k$ | 2 | 2 | 2 | 1 | 1 |

-continued

| k | j = 0 | j = 1 | j = 2 | j = 3 | j = 4 |
|---|---|---|---|---|---|
| Binary configuration of counter | [0] 1 0 | [0] 1 1 | 1 0 [0] | 0 0 0 | 0 0 1 |

We claim:

1. A distributed arithmetic oversampling recursive digital filter, comprising:
    (a) a recursive part of order q comprising a parallel loading register having an output terminal and an input terminal, and q−1 series registers each of r cells, r being an integer connected in cascade;
    (b) a non-recursive part of order p comprising series registers each of r cells each series register having one input terminal receiving input signals, said input signals being blockable P times out of N, wherein P and N are integers;
    (c) a modulo N counter with $\alpha$ output terminals;
    (d) a memory divided into N memory blocks, each of said memory blocks containing a set of calculated quantities characterizing the filtering to be carried out, said memory having $\alpha$ addressing input terminals corresponding to said blocks, said addressing input terminals being connected to said $\alpha$ outputs of said modulo N counter and said addressing input terminals within a block being connected to the output terminals of said series registers of said recursive and said non-recursive parts and said memory having an output terminal;
    (e) an adder-subtracter having an input terminal connected to the output terminal of said memory and having an output terminal;
    (f) an accumulator register having an input terminal connected to said output terminal of said adder-subtracter and having an output terminal connected to said input terminal of said parallel loading register and to said input terminal of said adder-subtracter;
    (g) a clock having a first output terminal connected to said parallel loading register and said series registers, said first output terminal delivering a clock signal at a frequency $rf_s$, and a second output terminal connected to said modulo N counter, said second output terminal delivering a clock signal at a frequency $f_s$, said filter having an input terminal for receiving samples at a sampling frequency $f_E$, said frequency $f_s$ of said clock being equal to $Nf_E$, said non-recursive part comprising at most K+1 series registers, K being an integer defined by the relationship $(K-1) N+2^\alpha-N \leq p+P-1 < KN+2^\alpha-N$, and wherein said filter further comprises a first plurality of first through Kth multiplexers each having first and second input terminals, a control input terminal and an output terminal, said output terminal of each said multiplexer being operatively connected to either said first or second input terminals according to a signal supplied to said control input signal, said second input terminal of each of said multiplexers being connected to the output terminal of an associated one of said series registers, said first input terminal of the jth multiplexer, j being an integer, $1 < j \leq K$, being connected to the output terminal of that one of said series registers associated with the (j−1)-th multiplexer said first input terminal of said first multiplexer being connected to said input of said filter, and said control input terminal of said j-th multiplexer being controlled by said modulo N counter in such a way that when the content of said modulo N counter is at a maximum, said output terminal of said j-th multiplexer is operatively connected to said first input terminal of said j-th multiplexer, thereby making said series registers circulating, and when the content of said modulo N counter differs from its maximum output, said output terminal of said j-th multiplexer, is operatively connected to said second input terminal.

2. A filter according to claim 1, wherein N is not equal to 2 to the $\alpha$ power and said non-recursive part comprises a (K+1)th series register multiplexed with an output $(\alpha_o)$ of said module N counter able to supply a non-significant bit for addressing said memory.

3. A filter according to claim 1, further comprising a second plurality of multiplexers and a module M counter, wherein said memory is preceeded by said second plurality of multiplexers each with M input terminals connected to said series registers, said multiplexers being controlled by said module M counter having output terminals which are connected to said addressing input terminals of said memory.

4. A filter according to claim 3, wherein M is not equal to 2 to the $\beta$ power, $\beta$ being an integer, and said second plurality of multiplexers are $2^\beta - M$ in number, each of said multiplexers having two further input terminals, with one of said further input terminals being connected to one of said output terminals of said modulo M counter able to supply a non-significant bit for addressing said memory.

* * * * *